United States Patent
Lenz

(10) Patent No.: US 11,824,504 B2
(45) Date of Patent: Nov. 21, 2023

(54) ERROR AMPLIFIER DEVICE

(71) Applicant: STMicroelectronics (Alps) SAS, Grenoble (FR)

(72) Inventor: Kuno Lenz, Voreppe (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 274 days.

(21) Appl. No.: 17/342,040

(22) Filed: Jun. 8, 2021

(65) Prior Publication Data
US 2021/0399702 A1     Dec. 23, 2021

(30) Foreign Application Priority Data

Jun. 17, 2020   (FR) ...................................... 2006326

(51) Int. Cl.
*H03F 1/02*   (2006.01)
*H03F 3/45*   (2006.01)

(52) U.S. Cl.
CPC ....... *H03F 3/45475* (2013.01); *H03F 1/0205* (2013.01); *H03F 3/45636* (2013.01);
(Continued)

(58) Field of Classification Search
CPC .............. H03F 3/45475; H03F 1/0205; H03F 3/45636; H03F 2203/45048; H03F 2203/45138; H03F 2200/129; H03F 2200/234; H03F 2200/252; H03F 2200/261; H03F 2200/375; H03F 2200/421; H03F 2200/429; H03F 2200/462; H03F 2203/45044; H03F 2203/45212; H03F 2203/45616; H03F 1/303; H03F 3/45977;
(Continued)

(56) References Cited

U.S. PATENT DOCUMENTS

| | | | | |
|---|---|---|---|---|
| 4,190,805 A | * | 2/1980 | Bingham | ................ H03F 1/303 |
| | | | | 330/69 |
| 7,321,260 B2 | * | 1/2008 | Larson | ................ H03F 3/45995 |
| | | | | 330/9 |

(Continued)

FOREIGN PATENT DOCUMENTS

WO     2007102863 A1    9/2007

OTHER PUBLICATIONS

Mihhailov, J. et al., "A continous output current measurement circuit for switching step down DC-DC regulator with a single sensing FET", 13th Biennial Baltic Electronics Conference (BEC2012), Tallinn, Estonia, Oct. 3-5, 2012, 4 pages.

(Continued)

*Primary Examiner* — Khanh V Nguyen
(74) *Attorney, Agent, or Firm* — Slater Matsil, LLP

(57) ABSTRACT

The present disclosure relates to a device comprising two error amplifier stages having their first inputs interconnected, their second inputs interconnected and their outputs coupled to an output of the device, each stage comprising an operational amplifier; a circuit for calibrating the amplifier; a switch coupling an input of the amplifier to the first input; a switch coupling another input of the amplifier to the second input; a switch coupling an output of the amplifier to the stage output; a switch having on state which short-circuits the inputs of the amplifier; and a switch coupling the output of the amplifier to the calibration circuit.

20 Claims, 4 Drawing Sheets

(52) U.S. Cl.
CPC .............. *H03F 2203/45048* (2013.01); *H03F 2203/45138* (2013.01)

(58) Field of Classification Search
CPC .......... H03F 1/34; H03F 3/45; H03F 3/45183; H03F 3/45179; H03F 1/02; H03F 3/72; H03F 1/0277
USPC ........................ 330/9, 51, 253; 327/124, 307
See application file for complete search history.

(56) References Cited

U.S. PATENT DOCUMENTS

| | | | |
|---|---|---|---|
| 9,496,833 B2* | 11/2016 | Kusuda | ............... H03F 3/45475 |
| 11,251,760 B2* | 2/2022 | Kusuda | ..................... H03F 3/72 |
| 2005/0237688 A1 | 10/2005 | Wong et al. | |
| 2006/0197574 A1 | 9/2006 | Naviasky et al. | |
| 2007/0229050 A1 | 10/2007 | Shigeta et al. | |
| 2009/0140802 A1* | 6/2009 | Kitagawa | ............... H03M 3/342 |
| | | | 330/9 |
| 2013/0015916 A1 | 1/2013 | Wan et al. | |
| 2015/0303805 A1 | 10/2015 | Franchini et al. | |
| 2016/0261187 A1 | 9/2016 | Deng | |
| 2017/0322240 A1 | 11/2017 | Poletto et al. | |
| 2019/0310290 A1 | 10/2019 | Araragi | |

OTHER PUBLICATIONS

Opris, Ion E., et al,. "A Rail-to-Rail Ping-Pong Op-Amp", IEEE Journal of Solid-State Circuits, vol. 31, No. 9, Sep. 1996, 5 pages.

\* cited by examiner

ERROR AMPLIFIER DEVICE

CROSS-REFERENCE TO RELATED APPLICATIONS

This application claims the priority benefit of French Application No. 2006326, filed on Jun. 17, 2020, which application is hereby incorporated herein by reference.

TECHNICAL FIELD

The present disclosure relates generally to electronic circuits, and more particularly to error amplifier devices.

BACKGROUND

Error amplifier devices, for example an operational amplifier, having two inputs and an output configured to provide a signal representative of an error, or difference, between these two inputs, are known.

Many electronic devices comprise an error amplifier device arranged in a feedback or control loop. When the error amplifying device has an intrinsic offset between its inputs, this falsifies the feedback or the control, or, in other words, it causes a malfunction of the electronic device comprising this feedback or control loop.

SUMMARY

There is a need to overcome all or part of the disadvantages of usual error amplifier devices, for example, when they are used in known devices for supplying a measurement current proportional to and smaller than a power current, the value of which is desired to be known.

An embodiment overcomes all or part of the disadvantages of known error amplifier devices.

One embodiment provides an error amplifier device comprising a first input, a second input and an output; and two error amplifier stages, each comprising: a first input connected to the first input of the device; a second input connected to the second input of the device; an output coupled to the output of the device; an operational amplifier; a circuit for calibrating the operational amplifier; a first switch coupling a first input of the operational amplifier to the first input of the stage; a second switch coupling a second input of the operational amplifier to the second input of the stage; a third switch coupling an output of the operational amplifier to the output of the stage; at least one fourth switch configured, at the on state, to short-circuit the first and second inputs of the operational amplifier; and a fifth switch coupling the output of the operational amplifier to a first input of the calibration circuit.

According to an embodiment, each stage is configured to implement a phase of calibration of the operational amplifier of the stage when the first, second and third switches of the stage are open and the fourth and fifth switches of the stage are closed.

According to an embodiment, each stage is configured, during a phase of amplifying an error where the first, second and third switches of the stage are closed and the fourth and fifth switches of the stage are open, to provide, on its output an output signal of the stage representative of a difference between the first and second inputs of the stage.

According to an embodiment, the device further comprises a circuit for controlling the switches of the two stages, the control circuit being configured so that, when one of the stages is in a phase of calibration, the other stage is in a phase of amplifying an error, and vice versa.

According to an embodiment, for each of the two stages, the control circuit is configured to: keep closed the first, second and third switches of the stage and keep open the fourth and fifth switches of the stage when the stage is in a phase of amplifying an error; and keep open the first, second and third switches of the stage and keep closed the fourth and fifth switches of the stage when the stage is in a phase of calibration.

According to an embodiment, in each of the two stages, a second input of the calibration circuit is connected to a node for applying a potential, the calibration circuit preferably comprising a capacitor connected between its first and second inputs.

According to an embodiment, in each of the two stages, the calibration circuit is configured to provide the operational amplifier of the stage at least one calibration signal based on a potential difference between its first and second inputs.

According to an embodiment, in each of the two stages, the calibration circuit comprises: a current source; a first MOS transistor having a source connected to a terminal of the current source, a gate connected to the first input of the calibration circuit and a drain connected to a first internal node of the operational amplifier of the stage; and a second MOS transistor identical to the first MOS transistor, having a source connected to the terminal of the current source, a gate connected to the second input of the calibration circuit and a drain connected to a second internal node of the operational amplifier of the stage.

According to an embodiment, in each of the two stages, the operational amplifier comprises a differential pair connected to the first and second inputs of the operational amplifier and to the first and second internal nodes of the operational amplifier.

According to an embodiment, in each of the two stages, the differential pair comprises a first MOS transistor having a gate connected to the first input of the operational amplifier and a drain connected to the first internal node, and a second MOS transistor, identical to the first MOS transistor, having a gate connected to the second input of the operational amplifier and a drain connected to the second internal node.

According to an embodiment, in each of the two stages, the operational amplifier comprises an output stage, preferably a folded cascode stage, coupling the differential pair to the output of the operational amplifier.

According to an embodiment, the output of each stage is connected to the output of the device.

According to an embodiment, the device further comprises a gain stage having an input connected to the output of each of the two stages and an output connected to the output of the device, and, preferably; a capacitor connected between the input and the output of the gain stage.

One other embodiment provides a device for supplying a measurement current comprising: a first branch configured to supply a first current, the first branch comprising a first MOS transistor having a drain connected to a first node for applying a supply potential and a source connected to the first input of an error amplifier device as described; and a second branch configured to supply the measurement current proportional and lower to the first current, the second branch comprising a second MOS transistor having a drain connected to the first node and a gate connected to a gate of the first MOS transistor, and a third MOS transistor connected to a source of the second MOS transistor, in series with the second MOS transistor, the source of the second MOS transistor being connected to the second input of the error amplifier device and the output of the error amplifier device being connected to a gate of the third MOS transistor.

According to an embodiment, a ratio of a width to a length of the first transistor of the first branch is equal to K times a ratio of a width to a length of the second transistor of the second branch, K being greater than 1,000, preferably than 10,000.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, it is considered, by way of example of application, a device for supplying a measurement current comprising an error amplifier device, it being understood that the embodiments and variants of error amplifying devices described here can be used in other applications, for example in a control loop of a duty cycle of a voltage converter signal where the duty cycle is controlled based on the difference between a set point value of an output voltage of the converter and a current value of this output voltage.

A device for supplying a measurement current is configured to supply a measurement current proportional to a power current, the power current having for example a value greater than or equal to 1 ampere. Due to its high value, it is not desirable to measure the power current directly. The device for supplying the measurement current is then configured so that the measurement current is lower than the power current, for example at least 1000 times lower, so that it can be measured by an usual circuit for measuring a current, and that a value of the power current can be deduced from the value of the measurement current.

Figure 1:
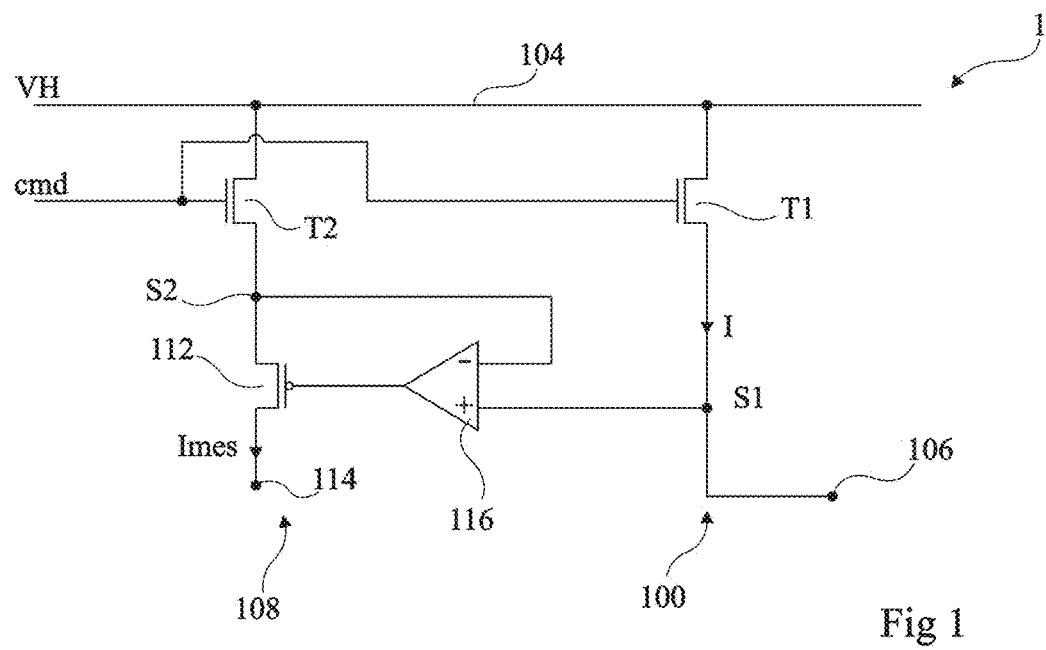
FIG. 1 schematically shows in the form of a circuit an example of a device for supplying a measurement current.

FIG. 1 schematically shows in the form of a circuit an example of a device 1 for supplying a measurement current Imes.

Device 1 comprises a first branch 100, called power branch. Branch 100 comprises a MOS ("Metal Oxide Semiconductor") transistor T1, for example, with an N channel. The drain of transistor T1 is connected to a node 104 of application of a power supply potential VH. The source S1 of transistor T1 is connected to a node 106 for supplying a first current I, called power current. As an example, the potential VH is supplied by a voltage source, for example a battery, and is for example equal to 14 V or to 48 V.

The flowing of the current I in the transistor T1, that is to say between its drain and its source S1, and therefore the supply of the current I to the node 106, is conditioned by a cmd signal applied to the gate of transistor T1, which determines the on or off state of transistor T1.

To obtain a second current Imes, called measurement current, which is smaller than and proportional to current I, device 1 comprises a second branch 108, called measurement branch.

Branch 108 comprises a MOS transistor T2, with a channel of the same type as the channel of transistor T1, in the present example with an N channel, and a MOS transistor 112, for example, with a P channel. Transistors T2 and 112 are series-connected. The drain of transistor T2 is connected to node 104. The gate of transistor T2 is connected to the gate of transistor T1 and thus receives the same control signal cmd. The source S2 of transistor T2 is connected to the source of transistor 112. The drain of transistor 112 is connected to a node 114 for supplying current Imes.

Transistor T2 is K times smaller than transistor T1. In other words, transistor T1 has a dimension ratio W/L, W being the width of transistor T1, that is, the width of its gate, and L being the length of transistor T1, that is, the length of its gate, equal to K times that of transistor T2. The dimension ratio K between transistors T1 and T2 is for example equal to at least 1,000, or even to at least 10,000. For example, transistor T1 is implemented by means of K transistors T2 in parallel.

Since transistors T1 and T2 have their gates connected together and their drains connected to the same node 104, and transistor T1 is K times larger than transistor T2, in order that current Imes is equal to 1/K times current I, it is sufficient for the potential of the source S2 of transistor T2 to be equal to that of the source S1 of transistor T1. In other words, measurement branch 108 should be controlled from power branch 100.

For this purpose, device 1 comprises an error amplifier device, here an operational amplifier 116, configured to control measurement branch 108 from power branch 100.

More particularly, amplifier 116 is configured to control transistor 112 so that the potential of the source S2 of transistor T2 is equal to the potential of the source S1 of transistor T1. Amplifier 116 has an inverting input (−) connected to the source S2 of transistor T2, and thus to the source of transistor 112, and a non-inverting input (+) connected to the source S1 of transistor T1. Further, the output of amplifier 116 is connected to the gate of transistor 112.

Operational amplifier 116, if it was perfect, would control transistor 112 so that the inverting and non-inverting inputs are equal. As a result, the potential of the source S2 of transistor T2 would be equal to that of the source S1 of transistor T1, and thus current Imes would be equal to 1/K times current I.

However, in practice, there is an intrinsic offset, or drift, between the inverting and non-inverting inputs of amplifier 116. Thus, in practice, when device 1 is in steady state, and the potentials of sources S1 and S2 should be equal, the potential offset is present between its inverting and non-inverting inputs, and thus between the value of the potential of source S1 and that of the potential of source S2. As a result, current Imes is not equal to 1/K times current I. The value of current I that can be deduced from the measurement of current Imes is then tainted with an error.

Figure 2:
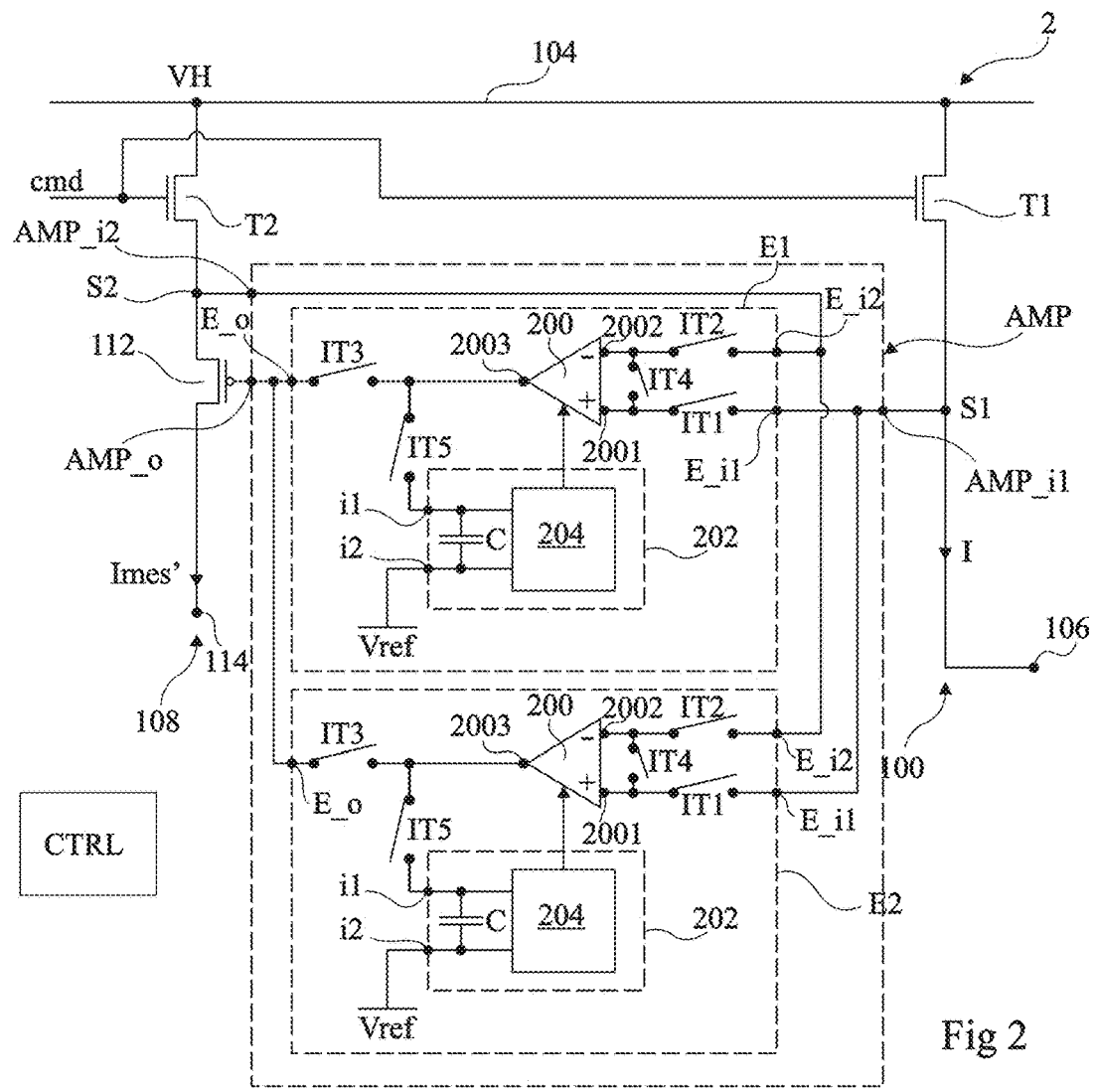
FIG. 2 schematically shows in the form of a circuit an embodiment of a device for supplying a measurement current.

FIG. 2 shows an embodiment of a device 2 for supplying a measurement current Imes'. Device 2 differs from device 1 in that it comprises an error amplifier device AMP (delimited in dotted lines in FIG. 2) in place of the amplifier 116.

More particularly, device 2 comprises, like device 1, the power branch 100 having the power current I flowing therethrough, and the measurement branch 108 having the current Imes' flowing therethrough.

Device 2 is configured to supply measurement current Imes' at a value equal to 1/K times the value of current I.

Device AMP comprises an input AMP_i1, an input AMP_i2 and an output AMP_0. Like the amplifier 116 of the device 1 of FIG. 1, the AMP device is configured so that its output AMP_0 provides a signal, typically a potential, representative of an error, or difference, between its inputs AMP_i1 and AMP_i2, and, more exactly, between a signal, typically a potential, received by its input AMP_i1 and a signal, typically a potential, received by its input AMP_i2. Thus, in device 2, the input AMP_i1 is coupled, preferably connected, to the source S1 of the transistor T1, the input AMP_i2 is coupled, preferably connected, to the source S2 of the transistor T2, and the output AMP_0 is coupled, preferably connected, to the gate of transistor 112.

Device AMP comprises two identical stages E1 and E2, stages E1 and E2 being delimited by dotted lines in FIG. 2. Each stage E1, E2 comprises an input E_i1 coupled, preferably connected, to the input AMP_i1, an input E_i2 coupled, preferably connected, to the input AMP_i2, and an output E_0 coupled, for example connected as shown in FIG. 2, to the AMP_0 output. Each stage E1, E2 is an error amplifier. More particularly, each stage E1, E2 is configured, when it is not in a calibration phase, to supply on its output E_0 a signal representative of the difference of potential between its inputs E_i1 and E_i2.

Each error amplifier E1, E2 comprises an operational amplifier 200 and a circuit 202 for calibrating the operational amplifier 200 of the stage, each circuit 202 being delimited by dotted lines in FIG. 2. Further, each error amplifier E1, E2, comprises a switch IT1 coupling an input 2001 of the operational amplifier 200 of the stage, for example the non-inverting input (+), to the input E_i1 of the stage, a switch IT2 coupling an input 2002 of the operational amplifier 200 of the stage, for example the inverting input (−), to the input E_i2 of the stage, a switch IT3 coupling an output 2003 of the operational amplifier 200 of the stage to the output E_0 of the stage, at least one switch IT4 configured, in the closed state, to short-circuit the inputs 2001 and 2002 of the operational amplifier 200 of the stage, and a switch IT5 coupling the output 2003 of the operational amplifier 200 of the stage to an input i1 of the calibration circuit 202 of the stage.

According to the embodiment illustrated in FIG. 2, each stage E1, E2 comprises a single switch IT4 connected between the inputs 2001 and 2002 of the amplifier 200 of the stage. In other words, this switch IT4 has a conduction terminal connected to the input 2001 of the amplifier 200, and another conduction terminal connected to the input 2002 of the amplifier 200.

According to an alternative embodiment not shown, each stage E1, E2 comprises two switches IT4, namely a first switch IT4 coupling the input 2001 of the amplifier 200 of the stage to a node for applying a potential, for example a potential different from the potential VH, for example a supply potential having a value lower than that of the potential VH, and a second switch IT4 coupling the input 2002 of the amplifier 200 of the stage to this same node.

The circuit 202 of each stage E1, E2 comprises an input i2 connected to a node for applying a potential Vref. The circuit 202 of each stage E1, E2 is configured to supply one or more calibration signals to the amplifier 200 of the stage, and more particularly to one or more internal nodes of the amplifier 200. The calibration signal(s) supplied to the amplifier 200 are signals for compensating the potential offset between the inputs 2001 and 2002 of the amplifier 200. The compensation signal(s) supplied by each circuit 202 are representative of a potential offset between the inputs i1 and i2 of this circuit 202.

Each stage E1, E2 is configured to implement first and second alternating operating phases. When a stage E1 or E2 is in a first operating phase, which in practice corresponds to a calibration phase of its amplifier 200, its switches IT1, IT2 and IT3 are open and its switches IT4 and IT5 are closed. In addition, when a stage E1 or E2 is in a second operating phase, which in practice corresponds to an error amplification phase where the output E_0 of the stage provides the signal representative of the difference between the inputs E_i1 and E_i2 of this stage, its switches IT1, IT2 and IT3 are closed and its switches IT4 and IT5 are open.

The device 2, preferably the device AMP, comprises a circuit CRTL for controlling the switches IT1, IT2, IT3, IT4 and IT5 of the stages E1 and E2. The control circuit CTRL is configured so that, when one of the stages E1 and E2 is in a first operating phase, the other stage is in a second operating phase, and vice versa. In addition, the circuit CTRL is configured to alternate that of stages E1 and E2 which is in the first phase of operation.

In other words, the CTRL circuit is configured, for each of the two stages E1 and E2, to keep the switches IT, IT2 and IT3 of the stage closed and keep the switches IT4 and IT5 of the stage open when the stage is in a first phase of operation, and to keep the switches IT, IT2 and IT3 of the stage open and keep the switches IT4 and IT5 of the stage closed when the stage is in a second phase of operation.

Thus, stages E1 and E2 control, alternately with respect to each other, measurement branch 108 of the device 2. In other words, when branch 108 is controlled by stage E2, stage E1 does not control branch 108 and, conversely, when branch 108 is controlled by stage E1, stage E2 does not control branch 108.

More particularly, each of error amplifying circuits E1 and E2 is configured, when it is in a first operating phase, so that the signal or potential available on its output E_0, thus the signal available on the output AMP_0 of device AMP allows to controls the transistor 112, so that the potential of source S2 of transistor T2 is equal to the potential of source S1 of transistor T1, that is, so that the difference between the potentials of sources S1 and S2 is zero. Thus, if the potential of source S2 becomes different from that of source S1, the potential of the output AMP_0 of device AMP is correspondingly modified, causing a modification of the gate potential of transistor 112, which causes a modification of the potential of the source S2 of transistor T2 which then becomes equal again, after a transient period, to that of the source S1 of transistor T1.

An advantage of providing two error amplifying stages E1 and E2 alternately controlling branch 108 from branch 100 is that the phase of calibration or self-calibration of the stage E1 or E2 which is not controlling branch 108 may be implemented while branch 108 remains controlled by the other stage, respectively E2 or E1. Thus, branch 108 is continuously controlled by the device AMP.

In addition, the implementation of calibration phases for each of the two stages E1 and E2 eliminates the potential offset between the AMP_i1 and AMP_i2 inputs of the AMP device. Thus, the AMP device makes it possible to control the branch 108 from the branch 100 so that the value of a current Imes' in the branch 108 is equal to 1/K times the value of the current I.

Indeed, during each phase of calibration of each stage E1, E2, the inputs 2001 and 2002 of the amplifier 200 of the stage are short-circuited and the output 2003 of the amplifier 200 of the stage, that is, the potential level supplied by the output 2003 of the amplifier 200, is then representative of the potential offset between these inputs 2001 and 2002. By way of example, the potential of the output 2003 of the amplifier 200 is then equal to the potential offset between the inputs 2001 and 2002 multiplied by the open loop gain of the amplifier 200. Since the switch IT5 of the stage is on, the output 2003 of amplifier 200 is present on input i1 of circuit 202. The potential difference between inputs i1 and i2 of circuit 202 is then representative of the potential offset between inputs 2001 and 2002 of amplifier 200. The signals of calibration of amplifier 200 delivered by circuit 202 are then determined by the potential difference between inputs i1 and i2 of circuit 202, to compensate for the potential offset between inputs 2001 and 2002 of amplifier 200.

By way of example, the value of the potential Vref is chosen to be substantially equal to that of the potential of the output 2003 of the amplifier 200 when the stage is in a first operating phase, so as to shift the parameters of the amplifier 200 as little as possible. According to another example, the value of the potential Vref is arbitrary as long as it does not cause saturation of the amplifier 200 when the stage is in a first operating phase.

According to an embodiment, the circuit 202 of each stage E1, E2 is configured to supply two currents, the difference between the two currents being determined by the potential difference between inputs i1 and i2 of circuit 202. The two currents are preferably respectively supplied to two outputs of a differential pair of amplifier 200.

According to an embodiment, the circuit 202 of each stage E1, E2 comprises a circuit 204 configured to deliver the calibration signal(s) to the amplifier 200 of the stage based on the potential difference between its inputs i1 and i2.

According to an embodiment, each circuit 204 comprises two identical MOS transistors having their sources connected together and to a node for supplying a bias current. One of the two transistors has its gate connected to input i1 of circuit 202 and delivers a first compensation current to a first internal node of amplifier 200, the other one of the two transistors having its gate connected to input i2 of circuit 202 and supplying a second compensation current to a second internal node of amplifier 200.

According to an embodiment, for each stage E1, E2, the potential difference between inputs i1 and i2 of circuit 202 is stored at the end of each calibration phase so that, for the next first operating phase, the output signal(s) of circuit 202 compensate for the potential offset between inputs 2001 and 2002 of amplifier 200.

According to an embodiment, each circuit 202 comprises a capacitor C connected between its inputs i1 and i2. Capacitor C enables to implement the above-described storage. Indeed, when switch IT5 switches from the off state to the on state, the potential difference between inputs i1 and i2 is stored across capacitor C.

To control transistor 112, rather than providing the device AMP comprising the two stages E1 and E2, it could have been devised to use a single one of stages E1 and E2, for example, stage E1, and an additional operational amplifier. The output of stage E1 would have been coupled to potential Vref by a memorization capacitor and to an internal node of the additional operational amplifier. The additional operational amplifier would have had its inverting input and its non-inverting input respectively connected to the source S2 of transistor T2 and to the source S1 of transistor T1. In this case, stage E1, in which the potential offset between inputs 2001 and 2002 of the amplifier 200 would have been compensated by the implementation of first and second alternating operating phases, would have allowed to load the memorisation capacitor, so that to compensate the potential offset between the inputs of the additional operational amplifier.

However, in such an assembly, a compensation capacitor would have been necessary between the output of the additional amplifier and an internal node of the additional amplifier to stabilize the loop comprising stage E1, the additional amplifier, and transistor 112. This compensation capacitor would have formed a conductive path from the gate of transistor 112 to the memorization capacitor. Thus, at a change of value of signal cmd, for example, a switching between two potential levels for example corresponding to two binary states of signal cmd, the variation of the output of the additional amplifier which would have resulted therefrom have disturbed the memorization capacitor, and the potential offset between the inverting and non-inverting inputs of the additional amplifier would no longer have been compensated for.

In the above-described device 2, the off state of the switch IT5 of the stage E1, E2 which is in a first operating phase allows to isolate the capacitor C of this stage from the outputs 2003 of the amplifiers 200 of stages E1 and E2. Thus, the calibration of amplifier 200 of a stage E1, E2, which is stored in capacitor C of this stage E1, E2, is not modified 0 during the first operating phases of this stage.

In addition, the off state of the switch IT3 of the stage E1, E2 which is in a second operating phase allows to isolate the capacitor C of this stage from the output 2003 of the amplifier 200 of the other stage. Thus, during a calibration phase of a stage E1, E2, the other stage has no influence on the calibration.

Figure 3:
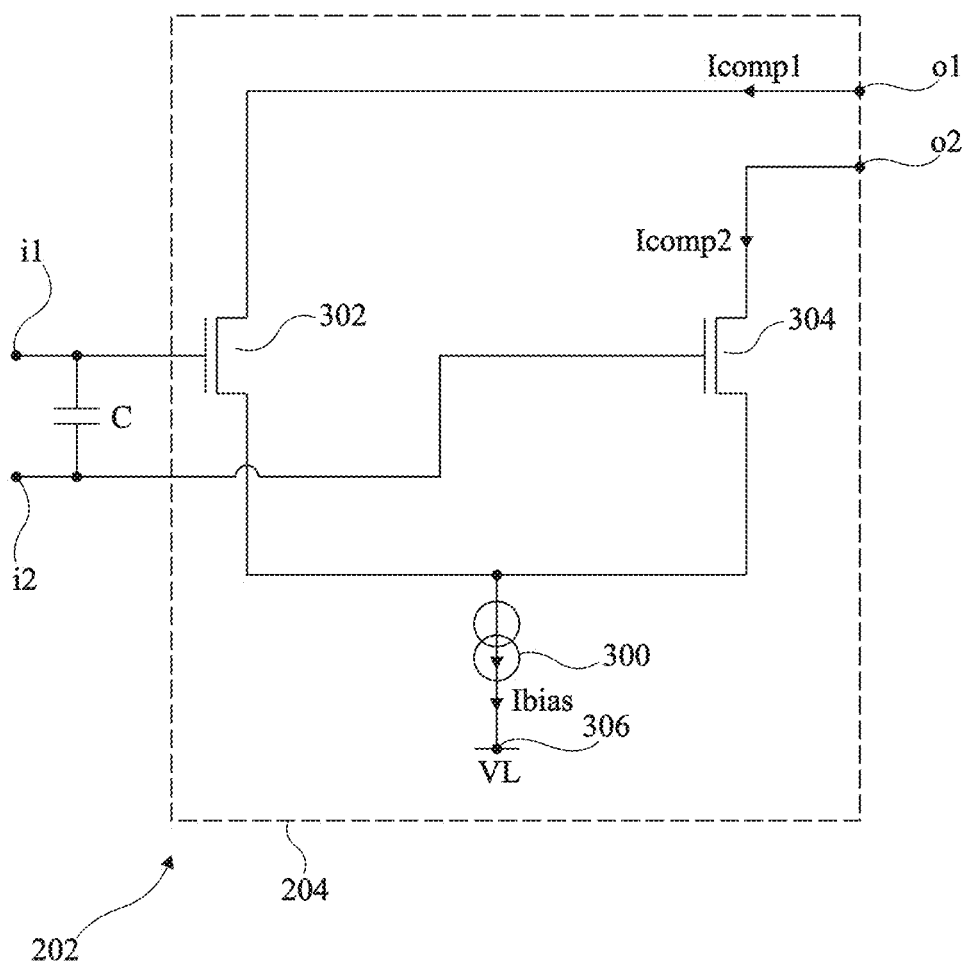
FIG. 3 shows in more detailed fashion and in the form of a circuit an embodiment of a portion of the device of FIG. 2.

FIG. 3 shows in more detailed fashion and in the form of a circuit an embodiment of a circuit 202 of the device 2 of FIG. 2.

The circuit 204 of circuit 202 is delimited by dotted lines in FIG. 3.

Circuit 204 comprises a current source 300 configured to deliver a bias current Ibias.

Circuit 204 further comprises two identical MOS transistors 302 and 304. The two transistors 302 and 304 have their sources connected to a terminal of current source 300. Transistor 302 has its gate connected to input i1 of circuit 202 and its drain connected to an output o1 of circuit 202. Symmetrically, transistor 304 has its gate connected to input i2 of circuit 202 and its drain connected to an output o2 of circuit 202. In this example, transistors 302 and 304 have an N channel.

The other terminal of current source 300 is connected to a node 306 of application of a power supply potential VI, different from power supply potential VH (FIG. 2), and, in this example, lower than potential VH. Potential VL is for example obtained from potential VH, for example so that the difference between potentials VH and VL is constant, for example equal to 3.3 V. Preferably, potential VL is the reference potential related to which all the potentials of device 2, and, more particularly, of device AMP, are referenced.

In the embodiment of FIG. 3, circuit 202 is configured to deliver a current Icomp1 to its output o1, and a current Icomp2 to its output o2. The value difference between currents Icomp1 and Icomp2 is representative of the potential difference between the inputs i1 and i2 of circuit 202 or, in other words, is determined by such a potential difference.

According to an embodiment, the amplifier 200 coupled to circuit 202 comprises a differential pair connected to the inputs 2001 and 2002 of amplifier 200 and to two internal nodes of amplifier 200, output o1 and output o2 of circuit 202 being respectively connected to one and the other of the two internal nodes. For example, one of the two internal nodes is a first output of the differential pair, the other one of the two nodes being a second output of the differential pair.

Figure 4:
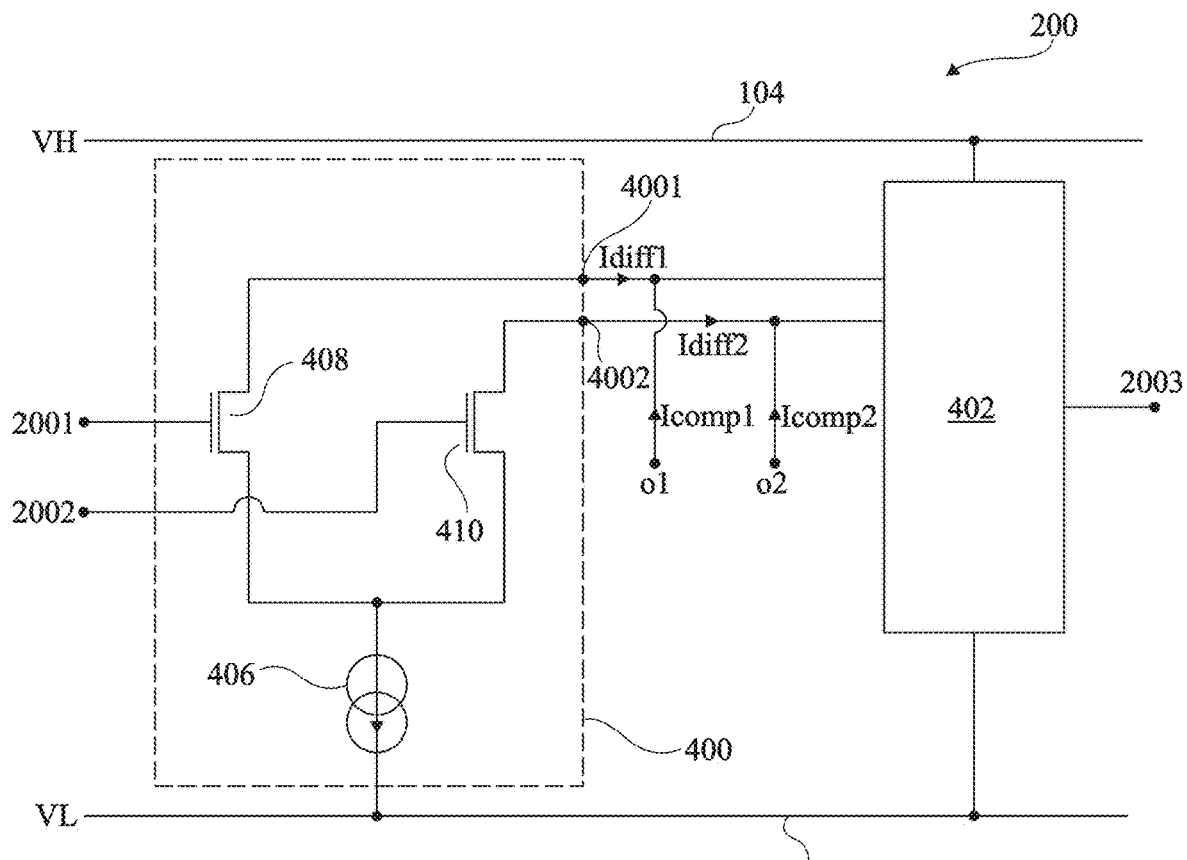
FIG. 4 shows in more detailed fashion and in the form of a circuit, an embodiment of another portion of the device of FIG. 2.

FIG. 4 shows in more detailed fashion and in the form of a circuit an embodiment of an amplifier 200 of the device 2 of FIG. 2.

Amplifier 200 comprises a differential pair 400, delimited by dotted lines in FIG. 4.

Differential pair 400 is connected between a node of application of a first power supply potential of amplifier 200, preferably node 104 at potential VH (FIG. 2), and a node of application of a second power supply potential of amplifier 200, preferably node 306 at potential VL (FIG. 3), here via an output stage 402 of the operational amplifier 200.

The differential pair forms the input stage of amplifier 200.

Differential pair 400 is connected to inputs 2001 and 2002 of amplifier 200. Differential pair 400 comprises, in this example, two outputs 4001 and 4002. Outputs 4001 and 4002 deliver respective currents Idiff1 and Idiff2, having their values determined by the difference between the potential of input 2001 of amplifier 200 and the potential of input 2002 of amplifier 200.

According to an embodiment, circuit 204 (FIGS. 2 and 3) is configured to deliver two compensation or calibration currents, and more particularly a different compensation current at each output 4001 and 4002 of differential pair 400. Preferably, circuit 204 (FIG. 2) is that described in relation with FIG. 3, the output o1 of circuit 200 delivering current Icomp1 being connected to output 4001 of differential pair 400 and the output o2 of circuit 204 delivering current IComp2 being connected to output 4002 of differential pair 400.

According to an embodiment, differential pair 400 comprises a current source 406 configured to deliver a bias current. Differential pair 400 further comprises two identical MOS transistors 408 and 410. In this example, transistors 408 and 410 have an N channel.

The two transistors 408 and 410 have their sources connected to a terminal of current source 406, the other terminal of current source 406 being connected to node 306 of application of power supply potential VL.

Transistor 408 has its gate connected to input 2001 of amplifier 200 and its drain connected to output 4001 of differential pair 400. Although not visible in FIG. 4, the drain of transistor 408 is further coupled to node 104 via the output stage 402.

Symmetrically, transistor 410 has its gate connected to input 2002 of amplifier 200 and its drain connected to output 4002 of differential pair 400. Although not visible in FIG. 4, the drain of transistor 410 is further coupled to node 104 via the output stage 402.

Outputs 4001 and 4002 of differential pair 400 are coupled, preferably connected, to the output stage 402 of amplifier 200. The output stage 402 of amplifier 200 is configured to supply the output signal or potential of amplifier 200. It will be within the abilities of those skilled in the art to implement the output stage 402 of amplifier 200. As an example, output stage 402 is a folded cascode stage.

More generally, those skilled the art are able to provide an amplifier 200 which is different from that described in relation to FIG. 4. For example, those skilled in the art can provide an operational amplifier 200 which differs from that of FIG. 4 in that: it comprises a first MOS transistor, for example with P channel, having a source connected to node 104 and a drain and a gate connected to each other and to node 4001; it comprises a second MOS transistor identical to the first transistor, the second MOS transistor having a source connected to the node 104, a drain connected to the node 4002, and a gate connected to the node 4001; and its output stage 402 couples, for example connects, the node 4002 to the output 2003 of the amplifier 200, the output stage being then, for example, a simple connection of node 4002 to the output 2003.

Figure 5:
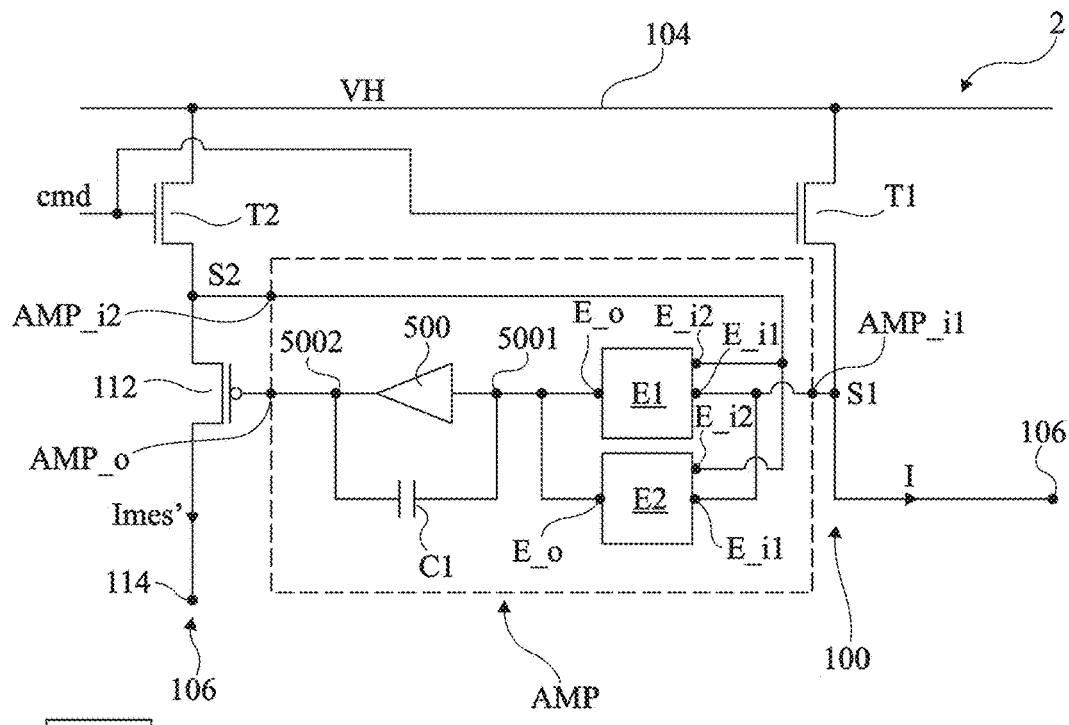
FIG. 5 schematically shows in the form of a circuit an alternative embodiment of the device of FIG. 2.

FIG. 5 schematically shows in the form of a circuit an alternative embodiment of the device 2 of FIG. 2. In FIG. 5, stages E1 and E2 have been shown in the form of blocks.

The device 2 of FIG. 5 differs from that of FIG. 2 in that the output of each stage E1, E2 is not directly connected to the gate of transistor 112. Indeed, in FIG. 5, the output of each of stages E1 and E2 is connected to a same input 5001 of a gain stage 500 having its output 5002 connected to the gate of transistor 112. In other words, in each stage E1, E2, switch IT3 (FIG. 2) is coupled to the gate of transistor 112 by gain stage 500.

Preferably, a capacitor C1, called Miller capacitor, is connected between the input 5001 and the output 5002 of amplifier circuit 500. Capacitor C1 enables to stabilize the regulation loop formed by stages E1, E2, circuit 500, and transistor 112.

Figure 6:
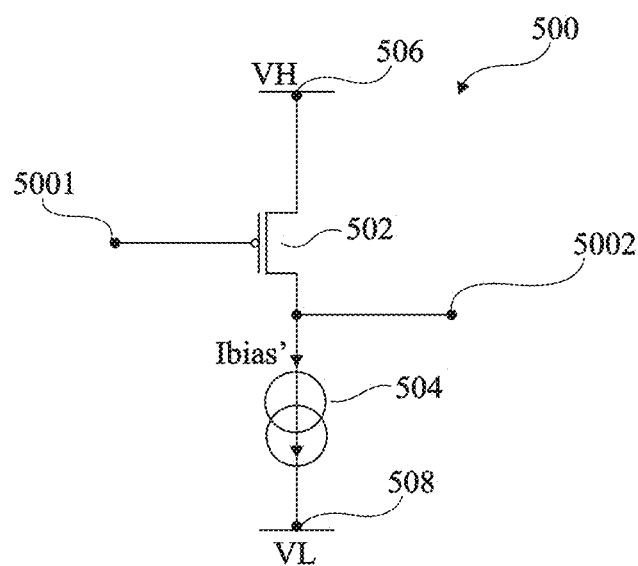
FIG. 6 shows in more detailed fashion and in the form of a circuit an embodiment of a portion of the device of FIG. 5.

FIG. 6 shows in more detailed fashion and in the form of a circuit an embodiment of amplifier circuit 500.

Circuit 500 comprises a MOS transistor 502 series-connected to a current source 504, between a node 506 of application of potential VH and a node 508 of application of potential VL. The gate of transistor 502 forms the input 5001 of circuit 500. The drain of transistor 502 forms the output 5002 of circuit 500 and is connected to current source 504.

In this example, transistor 502 has a P channel and has its source connected to node 506.

As an example, in the above-described device 2, potential VH is for example in the order of 48 V. As an example, in the above-described device 2, K is equal to 33,000.

According to an embodiment, the previously-described device 2 is fully implemented in integrated fashion, that is, it forms part of an integrated circuit.

According to an embodiment, the node 106 of device 2 is connected to a first power supply terminal of a motor, a second power supply terminal of the motor being for example connected to a device for delivering another power current.

Various embodiments and variants have been described. Those skilled in the art will understand that certain features of these various embodiments and variants may be combined, and other variants will occur to those skilled in the art. In particular, it will be within the abilities of those skilled in the art to implement circuits 204 different from that described in relation with FIG. 3, by adapting the connection between amplifier 200 and the output(s) of these other circuits 204. For example, it will be within the abilities of those skilled in the art to design a circuit 204 which comprises a single output signal.

It will also be within the abilities of those skilled in the art to adapt the previously described device 2 to the case where amplifiers 200 would be different from what has been described in relation with FIG. 4.

It will be within the abilities of those skilled in the art to adapt device 2 to the case where transistor 112 has an N channel, for example, by connecting each switch IT2 to the source S1 of transistor T1 rather than to the source S2 of transistor T2 as previously described, and by connecting each switch IT2 to the source S2 of transistor T2 rather than to the source S1 of transistor T1 as previously described.

Finally, the practical implementation of the described embodiments and variations is within the abilities of those skilled in the art based on the functional indications given hereinabove.

What is claimed is:

1. An error amplifier device comprising:
   a first device input, a second device input and a device output; and
   two error amplifier stages, each error amplifier stage comprising:
      a first input connected to the first device input;
      a second input connected to the second device input;
      an output coupled to the device output;
      an operational amplifier;
      a calibration circuit for calibrating the operational amplifier;
      a first switch coupling a first input of the operational amplifier to the first input of the error amplifier stage;
      a second switch coupling a second input of the operational amplifier to the second input of the error amplifier stage;
      a third switch coupling an output of the operational amplifier to the output of the error amplifier stage;
      at least one fourth switch configured, at an on state, to short-circuit the first and second inputs of the operational amplifier; and
      a fifth switch coupling the output of the operational amplifier to a first input of the calibration circuit.

2. The error amplifier device according to claim 1, wherein each error amplifier stage is configured to implement a phase of calibration of the operational amplifier of the error amplifier stage when the first, second and third switches of the error amplifier stage are open and the at least one fourth and fifth switches of the error amplifier stage are closed.

3. The error amplifier device according to claim 2, wherein each error amplifier stage is configured, during a phase of amplifying an error where the first, second and third switches of the error amplifier stage are closed and the at least one fourth and fifth switches of the error amplifier stage are open, to provide, on its output an output signal of the error amplifier stage representative of a difference between the first and second inputs of the error amplifier stage.

4. The error amplifier device according to claim 3, further comprising a control circuit for controlling the switches of the two error amplifier stages, the control circuit being configured so that, when one of the error amplifier stages is in the phase of calibration, the other of the error amplifier stages is in the phase of amplifying the error, and vice versa.

5. The error amplifier device according to claim 4, wherein, for each of the two error amplifier stages, the control circuit is configured to:
   keep closed the first, second and third switches of the error amplifier stage and keep open the at least one fourth and fifth switches of the error amplifier stage when the error amplifier stage is in the phase of amplifying the error; and
   keep open the first, second and third switches of the error amplifier stage and keep closed the at least one fourth and fifth switches of the stage when the error amplifier stage is in the phase of calibration.

6. The error amplifier device according to claim 1, wherein, in each of the two error amplifier stages, a second input of the calibration circuit is connected to a node for applying a potential, the calibration circuit comprising a capacitor connected between the first and second inputs of the calibration circuit.

7. The error amplifier device according to claim 6, wherein, in each of the two error amplifier stages, the calibration circuit is configured to provide the operational amplifier of the error amplifier stage at least one calibration signal based on a potential difference between the first and second inputs of the calibration circuit.

8. The error amplifier device according to claim 7, wherein, in each of the two error amplifier stages, the calibration circuit comprises:
   a current source;
   a first metal-oxide-semiconductor (MOS) transistor having a source connected to a terminal of the current source, a gate connected to the first input of the calibration circuit and a drain connected to a first internal node of the operational amplifier of the error amplifier stage; and
   a second MOS transistor identical to the first MOS transistor, having a source connected to the terminal of the current source, a gate connected to the second input of the calibration circuit and a drain connected to a second internal node of the operational amplifier of the error amplifier stage.

9. The error amplifier device according to claim 8, wherein, in each of the two error amplifier stages, the operational amplifier comprises a differential pair connected to the first and second inputs of the operational amplifier and to the first and second internal nodes of the operational amplifier.

10. The error amplifier device according to claim 9, wherein, in each of the two error amplifier stages, the differential pair comprises a third MOS transistor having a gate connected to the first input of the operational amplifier and a drain connected to the first internal node, and a fourth MOS transistor having a gate connected to the second input of the operational amplifier and a drain connected to the second internal node.

11. The error amplifier device according to claim 9, wherein, in each of the two error amplifier stages, the operational amplifier comprises a folded cascode stage coupling the differential pair to the output of the operational amplifier.

12. The error amplifier device according to claim 1, wherein the output of each error amplifier stage is connected to the device output.

13. The error amplifier device according to claim 1, further comprising a gain stage having an input connected to the output of each of the two error amplifier stages and an output connected to the device output, and a capacitor connected between the input and the output of the gain stage.

14. A supply device for supplying a measurement current, the supply device comprising:
an error amplifier device comprising:
a first error amplifier device input, a second error amplifier device input and an error amplifier device output; and
two error amplifier stages, each error amplifier stage comprising:
a first input connected to the first error amplifier device input;
a second input connected to the second error amplifier device input;
an output coupled to the error amplifier device output;
an operational amplifier;
a calibration circuit for calibrating the operational amplifier;
a first switch coupling a first input of the operational amplifier to the first input of the error amplifier stage;
a second switch coupling a second input of the operational amplifier to the second input of the error amplifier stage;
a third switch coupling an output of the operational amplifier to the output of the error amplifier stage;
at least one fourth switch configured, at an on state, to short-circuit the first and second inputs of the operational amplifier; and
a fifth switch coupling the output of the operational amplifier to a first input of the calibration circuit;
a first branch configured to supply a first current, the first branch comprising a first metal-oxide-semiconductor (MOS) transistor having a drain connected to a first node for applying a supply potential and a source connected to the first error amplifier device input of the error amplifier device; and
a second branch configured to supply the measurement current proportional to and lower than the first current, the second branch comprising a second MOS transistor having a drain connected to the first node and a gate connected to a gate of the first MOS transistor, and a third MOS transistor connected to a source of the second MOS transistor, in series with the second MOS transistor, the source of the second MOS transistor being connected to the second error amplifier device input and the error amplifier device output being connected to a gate of the third MOS transistor.

15. The supply device according to claim 14, wherein a first ratio of a width to a length of the first MOS transistor of the first branch is equal to K times a second ratio of a width to a length of the second MOS transistor of the second branch, wherein K is greater than 1,000.

16. The supply device according to claim 15, wherein K is greater than 10,000.

17. The supply device according to claim 14, wherein each error amplifier stage is configured to implement a phase of calibration of the operational amplifier of the error amplifier stage when the first, second and third switches of the error amplifier stage are open and the at least one fourth and fifth switches of the error amplifier stage are closed.

18. The supply device according to claim 14, wherein, in each of the two error amplifier stages, a second input of the calibration circuit is connected to a node for applying a potential, the calibration circuit comprising a capacitor connected between the first and second inputs of the calibration circuit.

19. The supply device according to claim 14, wherein the output of each error amplifier stage is connected to the error amplifier device output.

20. The supply device according to claim 14, wherein the error amplifier device further comprises a gain stage having an input connected to the output of each of the two error amplifier stages and an output connected to the error amplifier device output, and a capacitor connected between the input and the output of the gain stage.

* * * * *